(12) United States Patent
Kanamori et al.

(10) Patent No.: US 11,494,123 B2
(45) Date of Patent: Nov. 8, 2022

(54) MEMORY SYSTEM AND CONTROL METHOD THEREOF

(71) Applicant: KIOXIA CORPORATION, Tokyo (JP)

(72) Inventors: Katsuya Kanamori, Yokohama Kanagawa (JP); Takafumi Fujita, Yokohama Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/150,991

(22) Filed: Jan. 15, 2021

(65) Prior Publication Data

US 2021/0216248 A1     Jul. 15, 2021

(30) Foreign Application Priority Data

Jan. 15, 2020   (JP) .............................. JP2020-004306

(51) Int. Cl.
*G06F 3/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC .... G06F 3/0659; G06F 3/0673; G06F 3/0679; G06F 3/0604; G06F 3/061; G06F 12/023; G06F 12/1009; G06F 13/1636; G06F 2212/1016; G06F 2212/152; G06F 2212/20; G06F 2212/657; G06F 3/0665; G06F 3/0611; G06F 13/1668; G06F 13/1689; G06F 3/0658; G06F 13/1621; G06F 3/0613; G06F 3/0647; G06F 3/0652; G06F 3/0656; G06F 3/068; G06F 11/1471; G06F 11/1641; G06F 11/1683; G06F 12/0246; G06F 12/0866; G06F 12/0895; G06F 13/16; G06F 13/24; G06F 16/60; G06F 3/0481; G06F 3/04847; G06F 3/0625; G06F 3/0631; G06F 3/0634; G06F 3/064; G06F 3/0653; G06F 3/0662; G06F 3/0688; G06F 3/16;
(Continued)

(56) References Cited

U.S. PATENT DOCUMENTS 8,645,656 B2   2/2014  Yoon et al.
9,146,860 B2   9/2015  Kondo
(Continued)

*Primary Examiner* — Thong Q Le
(74) *Attorney, Agent, or Firm* — Kim & Stewart LLP

(57) ABSTRACT

A memory system includes a non-volatile memory, and a controller configured to issue a first command requesting a first operation to the non-volatile memory and a second command to the non-volatile memory. The second command may be for requesting a duration time of the first operation or for requesting an execution stage of the first operation. In accordance with the information returned by the non-volatile memory in response to the second command, the controller issues a third command requesting a completion status of the first operation to the non-volatile memory. The first operation may be a data read operation, a data write operation, or a data erase operation.

20 Claims, 11 Drawing Sheets

(51) Int. Cl.
  *G11C 16/10* (2006.01)
  *G11C 16/14* (2006.01)
  *G11C 16/34* (2006.01)
(52) U.S. Cl.
  CPC .............. *G11C 16/10* (2013.01); *G11C 16/14* (2013.01); *G11C 16/3445* (2013.01); *G11C 16/3459* (2013.01)
(58) Field of Classification Search
  CPC . G06F 9/3855; G06F 9/4812; G11C 11/4076; G11C 11/4093; G11C 11/4096; G11C 11/4099; G11C 16/10; G11C 16/14; G11C 16/34; G11C 7/00; G11C 7/10
  See application file for complete search history.

(56) References Cited

U.S. PATENT DOCUMENTS

| | | | |
|---|---|---|---|
| 2016/0232112 A1 | 8/2016 | Lee | |
| 2018/0275920 A1* | 9/2018 | Koo | ................. G06F 3/0611 |
| 2019/0026220 A1 | 1/2019 | Lee et al. | |

* cited by examiner

FIG. 8
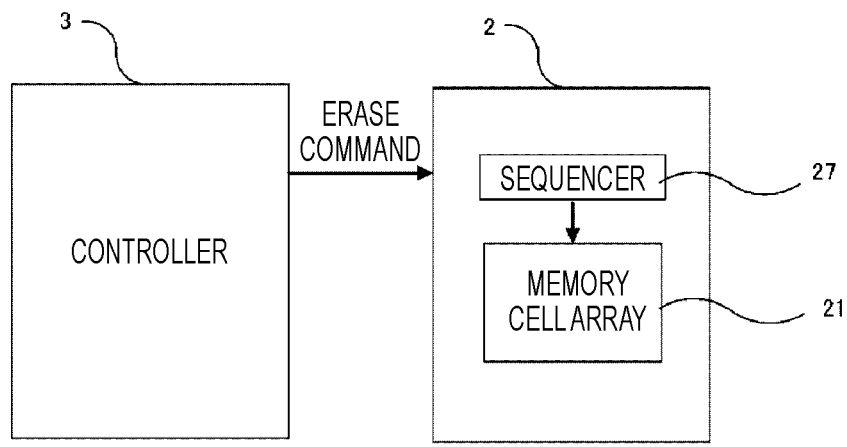
FIG. 9
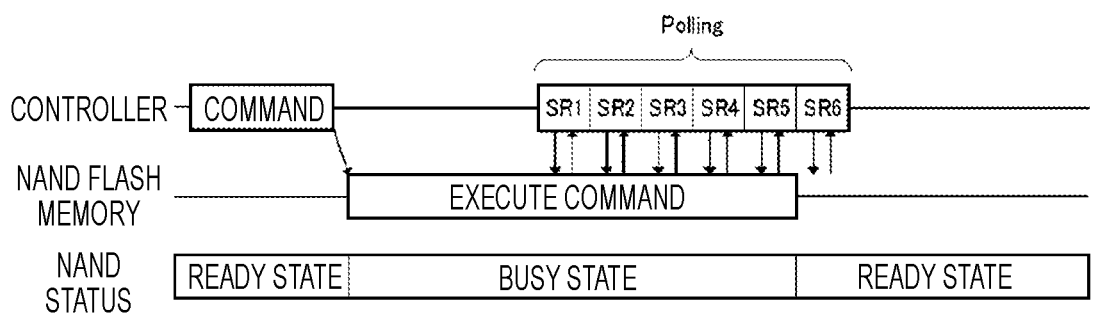
FIG. 10
| Upper page | Lower page |
|---|---|
| Tup | Tlow |

MEMORY SYSTEM AND CONTROL METHOD THEREOF

CROSS-REFERENCE TO RELATED APPLICATION(S)

This application is based upon and claims the benefit of priority from Japanese Patent Application No. 2020-004306, filed on Jan. 15, 2020, the entire contents of which are incorporated herein by reference.

FIELD

Embodiments described herein relate generally to a memory system and a control method thereof.

BACKGROUND

A memory system includes a non-volatile memory and a controller that controls the non-volatile memory.

DESCRIPTION OF THE DRAWINGS

FIG. 8 is a block diagram illustrating the data erase operation according to the first embodiment.

FIG. 9 is a time chart illustrating status polling according to the first embodiment.

FIG. 10 is a table used during the data read operation according to the first embodiment.

DETAILED DESCRIPTION

Figure 1:
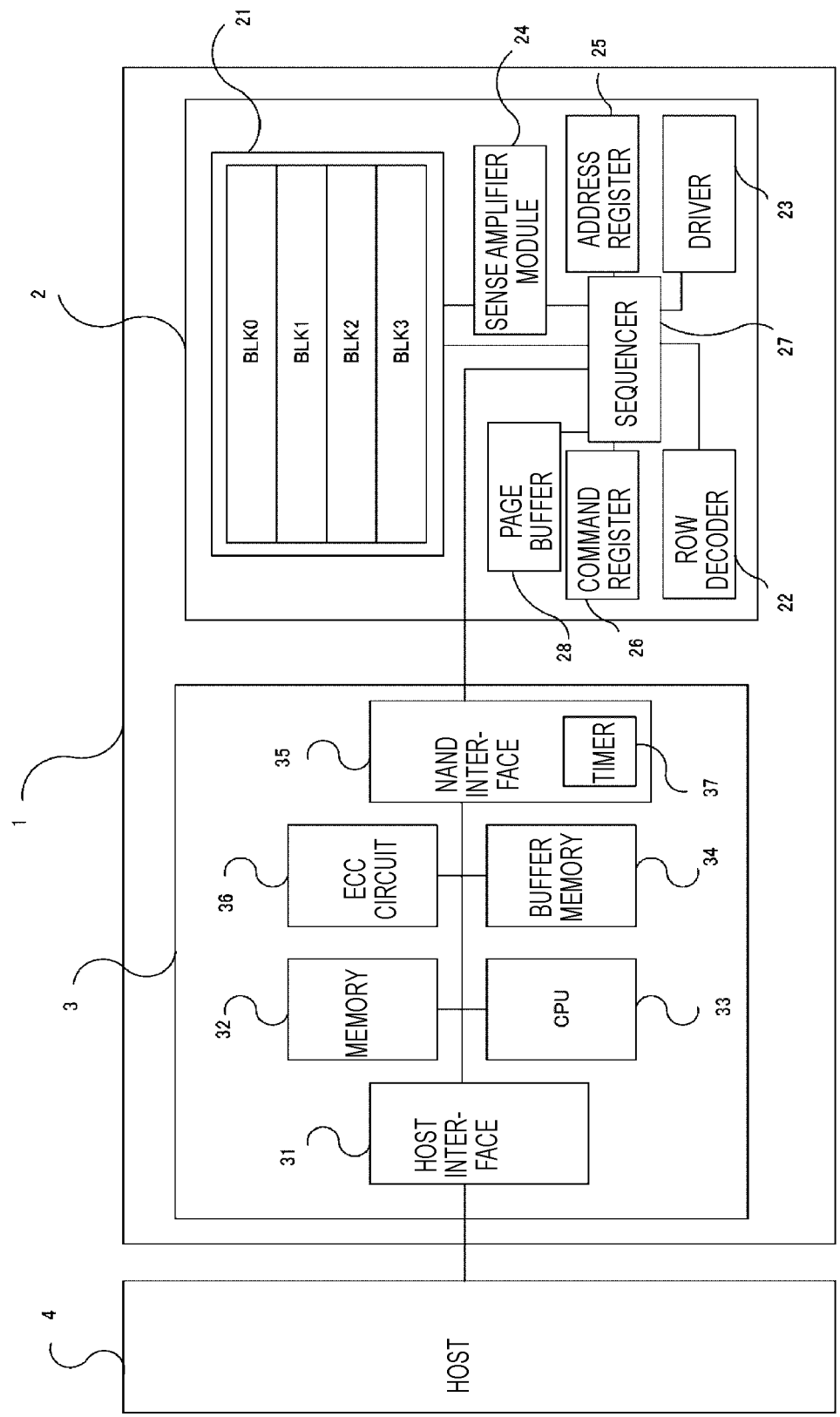
FIG. 1 is a block diagram of a memory system according to a first embodiment.

Embodiments of the present application provide a memory system in which the efficiency of status polling operations is improved.

In general, according to one embodiment, the memory system includes a non-volatile memory and a controller configured to issue a first command requesting a first operation to the non-volatile memory, and a second command requesting a duration time of the first operation to the non-volatile memory.

Hereinafter, embodiments will be described.

In the present specification, certain elements are described using plural expressions, and such expressions are merely examples, so that they may be described using other expressions. Further, an element may be described using another expression in situations where plural expressions are not used. In addition, in the following description, common reference numerals are given to elements having the same function and configuration.

The drawings are schematic, and the relationship between the thickness and the plane dimension, and a thickness ratio of each layer may differ from actual ones. In addition, the drawings may have portions where the dimensional relationships and ratios are different from each other.

First Embodiment

FIG. 1 is a block diagram illustrating an outline of a memory system according to a first embodiment.

As illustrated in FIG. 1, the memory system 1 includes a non-volatile memory (e.g., a NAND-type flash memory) 2 and a controller 3. Examples of the memory system 1 include a memory card such as an SD™ card and a solid state drive (SSD). The non-volatile memory 2 is not limited to the NAND-type flash memory and may be a NOR-type flash memory. Hereinafter, the non-volatile memory 2 will be referred to as a NAND flash memory 2.

The NAND flash memory 2 includes a memory cell array 21 and stores data in a non-volatile manner. The controller 3 controls the NAND flash memory 2 and accesses the NAND flash memory 2 in response to a command received from a host 4. The host 4 is, for example, a digital camera or a personal computer.

Details of the configuration of the controller 3 will be described with reference to FIG. 1.

The controller 3 is composed of, for example, a system-on-a-chip (SoC), and includes a host interface 31, a memory 32, a CPU 33, a buffer memory 34, a NAND interface 35, and an ECC circuit 36. The functions of the respective units 31 to 36 of the controller 3 may be implemented by hardware, or may be implemented by a combination of hardware and firmware. The controller 3 is connected to the host 4 by the host interface 31 and connected to the NAND flash memory 2 by the NAND interface 35.

The host interface 31 connects the controller 3 and the host 4 to transfer requests and data received from the host 4 to the CPU 33 and the buffer memory 34, respectively. Further, in response to the instruction from the CPU 33, the data in the buffer memory 34 is transferred to the host 4. The host interface 31 performs an operation based on standard protocols, for example, an SD™ interface, a serial attached small computer system interface (serial attached SCSI; SAS), a serial advanced technology attachment (serial ATA; SATA), or a non-volatile memory express (NVMe).

The memory 32 is a semiconductor memory such as a static random access memory (SRAM), and is used as a work area of the CPU 33. The memory 32 stores firmware which controls the NAND flash memory 2, or various management tables.

The CPU 33 controls the entire operation of the controller 3. For example, when receiving a write request from the host 4, the CPU 33 instructs the NAND interface 35 to write. The same applies to a read operation and an erase operation.

The buffer memory 34 is, for example, a dynamic random access memory (DRAM), and temporarily stores write data and read data.

The NAND interface 35 connects the NAND flash memory 2 and the controller 3. The NAND interface 35 generates a command based on the instruction received from the CPU 33 and issues the generated command to the NAND flash memory 2. During the write operation, the NAND interface 35 transfers a write command generated based on the instruction of the CPU 33 and write data in the buffer memory 34 to the NAND flash memory 2. At the time of the read operation, a read command generated based on the instruction of the CPU 33 is issued to the NAND flash memory 2, and data read from the NAND flash memory 2 is transferred to the buffer memory 34.

The NAND interface 35 further includes a timer 37. The timer 37 measures time according to a status acquired from the NAND flash memory 2. When the time to be measured elapses, the timer 37 interrupts the CPU 33.

The ECC circuit 36 performs an error detection operation and an error correction operation for data stored in the NAND flash memory 2. That is, the ECC circuit 36 generates an error correction code at the time of writing data and adds the code to the write data. At the time of the data read operation, the error correction code added to the write data is decoded to detect the presence or absence of error bits. When the error bits are detected, the position of the error bits is specified and the error is corrected. The error correction method includes, for example, a hard decision decoding (hard bit decoding) and a soft decision decoding (soft bit decoding). The hard decision decoding may use, for example, the Bose-Chaudhuri-Hocquenghem (BCH) code or the RS (Reed-Solomon) code. A low density parity check (LDPC) code may be used for the soft decision decoding.

Next, the configuration of the NAND flash memory 2 will be described. As illustrated in FIG. 1, the NAND flash memory 2 includes a memory cell array 21, a row decoder 22, a driver 23, a sense amplifier module 24, an address register 25, a command register 26, a sequencer 27, and a page buffer 28.

The memory cell array 21 includes a plurality of non-volatile memory cells formed on a substrate. The memory cells are connected by word lines and bit lines. Each of the memory cells includes a memory cell transistor and stores data in a non-volatile manner according to a threshold voltage. A plurality of memory cells connected to a single word line is defined as a memory cell group. When the memory cells store data one bit at a time, the amount of data stored in the memory cell group is defined as one page. When the memory cells store data in units of 2 bits, the amount of data stored in the memory cell group is defined as two pages. Further, the memory cell array 21 includes a plurality of areas called blocks (BLKs), each of which is a unit of the data erase operation, and FIG. 1 illustrates four blocks BLK0 to BLK3 as an example. Each of the blocks BLK has a plurality of memory cell groups. The memory cell array 21 stores data received from the controller 3.

The row decoder 22 selects one of the blocks BLK0 to BLK3 based on a block address in the address register 25, and further selects a word line in the selected block BLK.

The driver 23 supplies a voltage to the word line selected via the row decoder 22 based on a page address in the address register 25.

The sense amplifier module 24 senses a current flowing through the bit line when reading data. When a sense command is issued from the controller 3 at the time of reading data, the driver 23 applies a read voltage to the word line in the memory cell array 21. The sense amplifier module 24 senses the current flowing through the bit line and reads the data. The read data is temporarily stored in the page buffer 28. When the controller 3 issues a data-out-command, the data stored in the page buffer 28 is output to the controller 3.

At the time of writing data, write data received from the controller 3 is temporarily stored in the page buffer 28 according to a data-in-command issued from the controller 3. When the controller 3 issues a program command, the write data stored in the page buffer 28 is written in the memory cell array 21.

The address register 25 stores an address received from the controller 3. This address includes the above-described block address and page address. The command register 26 stores a command received from the controller 3.

The sequencer 27 controls the entire operation of the NAND flash memory 2 based on the command stored in the command register 26.

Figure 2:
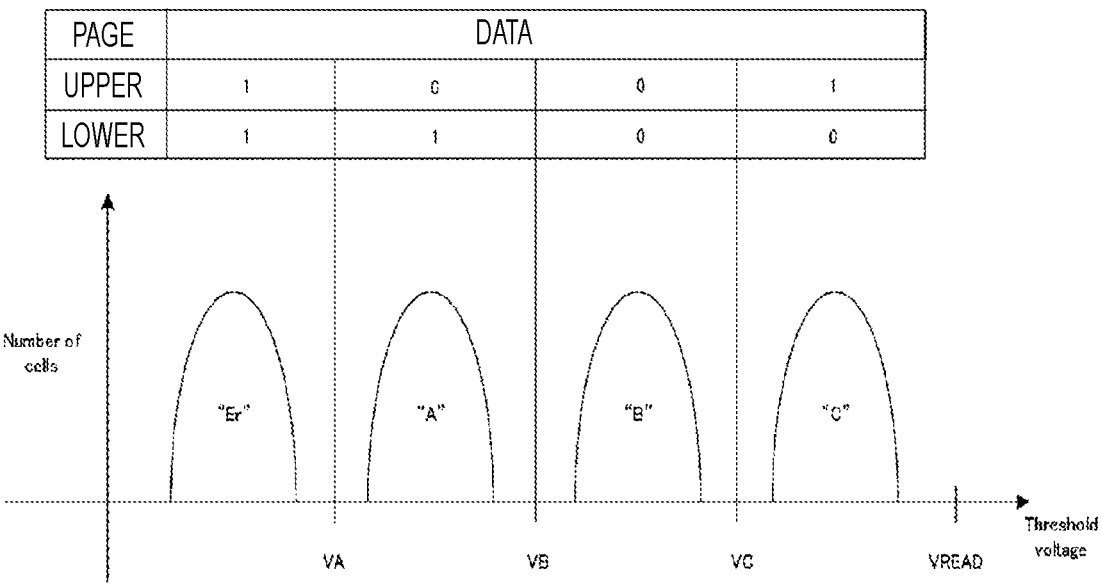
FIG. 2 is a diagram illustrating a threshold voltage distribution and a read voltage of a memory cell when one memory cell stores 2-bit data.

FIG. 2 illustrates a threshold voltage distribution and a read voltage of memory cells when one memory cell stores 2-bit data, that is, when data is stored in each memory cell by a multi-level cell (MLC) method. The vertical axis corresponds to the number of memory cells, and the horizontal axis corresponds to the threshold voltage Vth of the memory cells. The plurality of memory cells form a plurality of threshold voltage distributions based on the number of bits of data stored therein.

In the case of the MLC method, the plurality of memory cells form four threshold voltage distributions. The four threshold voltage distributions are referred to as an "Er" state, an "A" state, a "B" state, and a "C" state in an order from the lowest threshold voltage. In the MLC method, for example, data of "11" (upper bit/lower bit), data of "01," data of "00," and data of "10" are allocated to the "Er" state, the "A" state, the "B" state, and the "C" state, respectively.

The read voltage is set between the adjacent threshold voltage distributions. For example, a read voltage VA is set between the highest threshold voltage in the "Er" state and the lowest threshold voltage in the "A" state, and is used in the operation of determining whether the threshold voltage of the memory cell is included in the threshold voltage distribution of the "Er" state or the threshold voltage distribution of the "A" state or higher. When the read voltage VA is applied to the memory cell, the memory cell corresponding to the "Er" state is turned on and the memory cell corresponding to the "A" state or higher is turned off. Other read voltages are similarly set. That is, a read voltage VB is set between the threshold voltage distribution of the "A" state and the threshold voltage distribution of the "B" state, and the read voltage VC is set between the threshold voltage distribution of the "B" state and the threshold voltage distribution of the "C" state. A read pass voltage VREAD is set to a voltage which is higher than the highest threshold voltage in the threshold voltage distributions having the highest threshold voltage. That is, when the read pass voltage VREAD is applied, the memory cell is turned on regardless of the data stored therein.

The number of bits of data stored in one memory cell and the allocation of data to the threshold voltage distribution of the memory cell described above are examples, and a single-level cell (SLC) method or a triple-level cell (TLC) method may be used. Data allocation other than the above may be applied to the threshold voltage distribution.

One read level VB is used to read the lower page in the MLC method, and two read levels VA and VC are used to read the upper page in the MLC method. When the number of read levels used for reading increases, the sense time also increases. For example, when one read level is used, the sense time tR is 30 μs, and when two read levels are used, the sense time tR is 50 μs. The difference in the number of read levels used for reading each page greatly affects the difference in the sense time tR. In the MLC method, the sense time for reading the lower page is shorter than the sense time for reading the upper page.

<1> Basics of Read Operation

Figure 3:
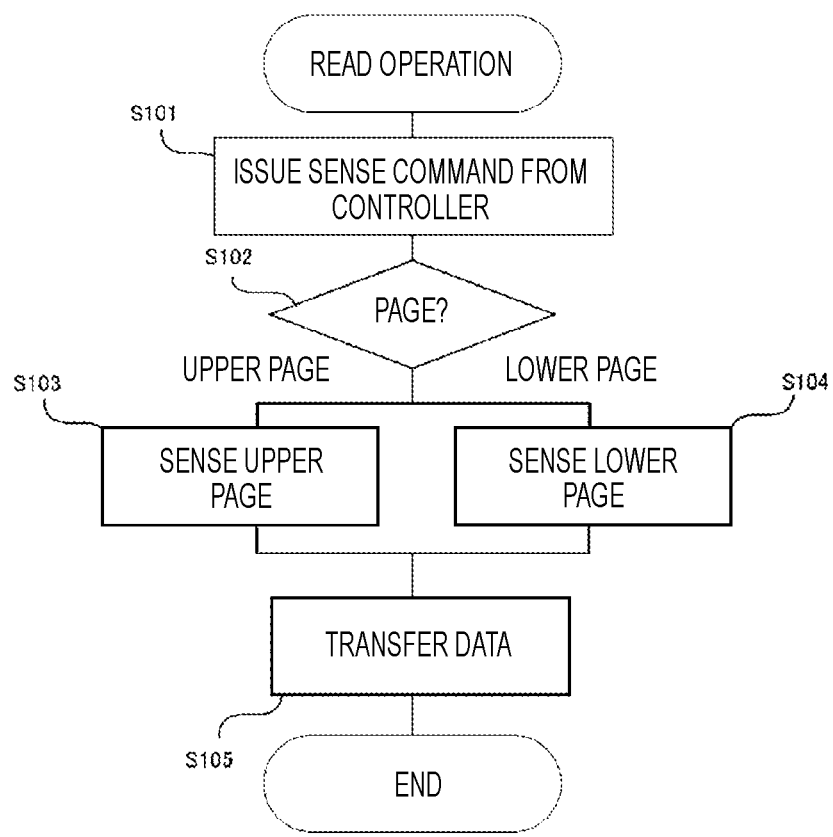
FIG. 3 is a flowchart illustrating the steps of a data read operation according to the first embodiment.
Figure 4:
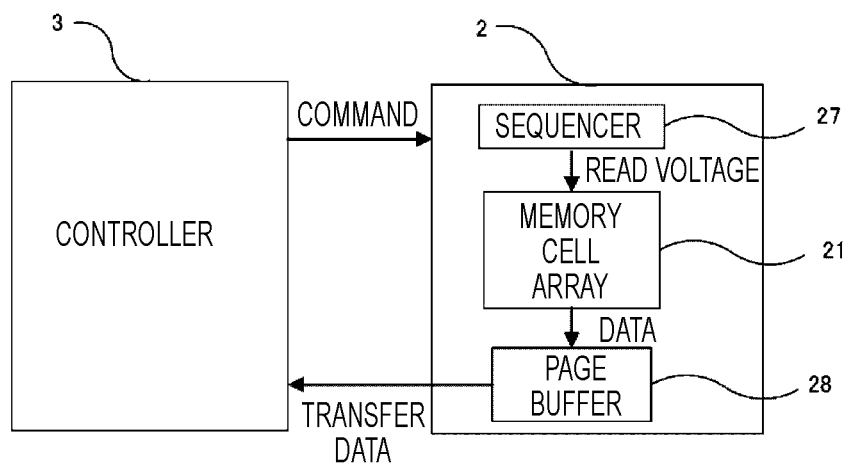
FIG. 4 is a block diagram illustrating the data read operation according to the first embodiment.

The basics of the read operation will be described with reference to FIGS. 3 and 4. Here, the read operation of the MLC method will be described. The read operation includes a sense operation and a data transfer operation.

The sense operation is an operation in which the sense amplifier module 24 determines data stored in the memory cell. When a sense command including an address is issued from the controller 3 (step S101), the sequencer 27 determines a word line and page to be sensed based on the address (step S102). The sequencer 27 applies a read voltage to the word line to be sensed and performs an upper page sensing (step S103) or a lower page sensing (step S104) based on the page to be sensed. The sense amplifier module 24 senses the current flowing through each bit line and determines the data. The sequencer 27 determines that the data stored in a memory cell (at the intersection of the word line and the bit line) is "1" when current flows through the bit line (e.g., for lower page sensing, when the threshold voltage of the memory cell is equal to or lower than the read voltage VB), and that the data stored in the memory cell is "0" when the current does not flow (e.g., for lower page sensing, when the threshold voltage of the memory cell is higher than the read voltage VB). The read data is temporarily stored in the page buffer 28.

The data transfer operation is an operation of transferring data temporarily stored in the page buffer 28 to the controller 3. When a data-out-command is issued from the controller 3, the data read from the memory cells to the page buffer 28 is transferred from the page buffer 28 to the controller 3 (step S105), and the read operation is completed.

<2> Basics of Write Operation

Figure 5:
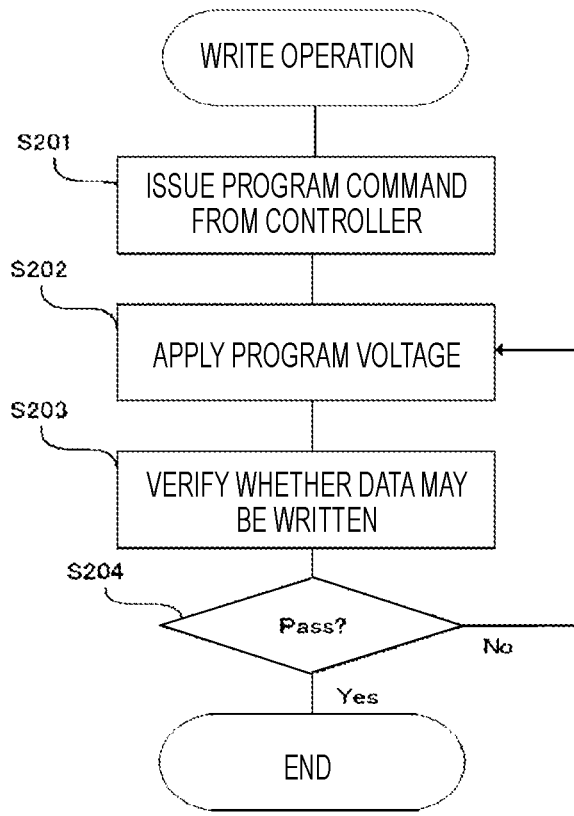
FIG. 5 is a flowchart illustrating the steps of a data write operation according to the first embodiment.
Figure 6:
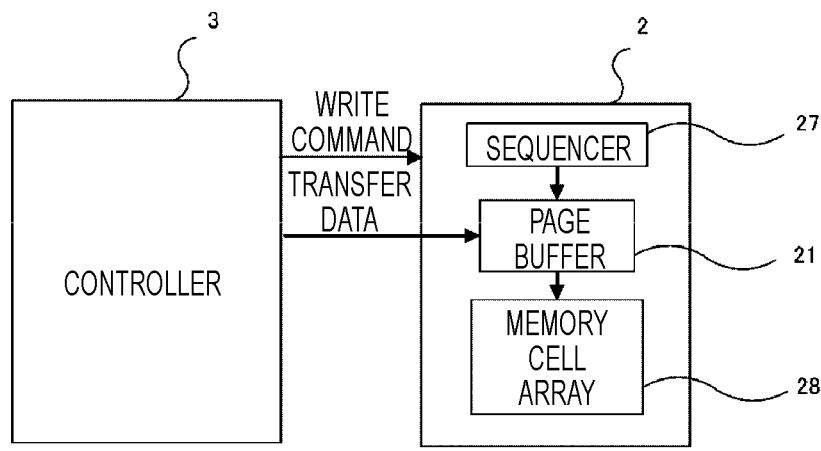
FIG. 6 is a block diagram illustrating the data write operation according to the first embodiment.

The basics of the write operation will be described with reference to FIGS. 5 and 6. A data-in-command is issued from the controller 3, and data from the controller 3 is transferred to the page buffer 28. Further, when a program command is issued from the controller 3, the NAND flash memory 2 performs a write operation during which data is written in the memory cell array 21. The write operation includes a first step and a second step. The first step is a program operation of executing the program requested by the program command, and the second step is a program verify operation of verifying the completion of the program operation.

The program operation refers to an operation of increasing the threshold voltage of the memory cell by applying a program voltage, and the program verify operation refers to an operation of verifying whether the threshold voltage of the memory cell has reached the target threshold voltage. When the program command is issued from the controller 3 (step S201), the sequencer 27 applies a program voltage Vpgm to the word line (step S202). Subsequently, the sequencer 27 applies a program verify voltage Vpvrf to the word line to which the program voltage Vpgm has been applied, and senses the current flowing through the bit line in the sense amplifier module 24 to verify the threshold voltage in each of the memory cells connected to the word line(step S203). When the threshold voltage in each memory cell has reached the target threshold voltage ("Yes" in step S204), the write operation is completed. Otherwise ("No" in step S204), the process returns to the step of applying the program voltage Vpgm again (step S202). A series of processes including application of the program voltage Vpgm and verification of the threshold voltage by applying the program verify voltage Vpvrf is called a program loop. When the threshold voltage in each memory cell has not reached the target threshold voltage and the program operation is performed again, the magnitude of the program voltage Vpgm is made larger than the program voltage Vpgm of the previous program loop. The program loop is repeated until the threshold voltage of each memory cell reaches the target threshold voltage.

<3> Basics of Erase Operation

Figure 7:
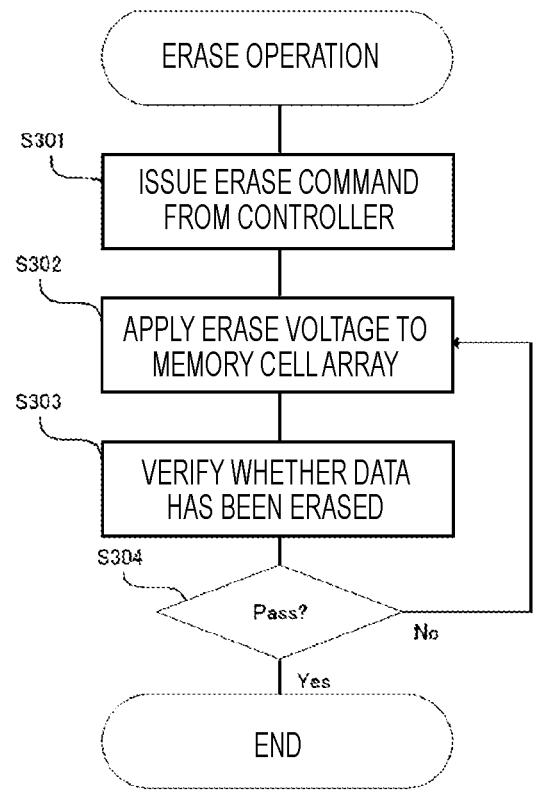
FIG. 7 is a flowchart illustrating the steps of a data erase operation according to the first embodiment.

The erase operation will be described with reference to FIGS. 7 and 8. When an erase command is issued from the controller 3, the NAND flash memory 2 starts the erase operation. The erase operation includes a first step and a second step. The first step is an erase voltage apply operation of executing the erase requested by the erase command, and the second step is an erase verify operation of verifying the completion of the erase operation.

The erase voltage apply operation is an operation of lowering the threshold voltage of the memory cell by applying the erase voltage to a substrate of the memory cell array 21, and the erase verify operation is an operation of verifying whether the threshold voltage of each memory cell in the memory cell array 21 has reached the threshold voltage of the Er state. When the erase command is issued from the controller 3 (step S301), the sequencer 27 applies an erase voltage VEr to the substrate of the memory cell array 21 (step S302). Further, the erase verify voltage Vevrf is applied to each word line in the memory cell array 21 to which the erase voltage VEr is applied, and the sense amplifier module 24 senses the current flowing in the bit line to verify that the threshold voltages of all memory cells connected to the bit line are of the ER state (step S303). When the threshold voltages of all the memory cells are lower than the target threshold voltage ("Yes" in step S304), the erase operation is completed, and otherwise ("No" in step S304), the process returns to the step of applying the erase voltage VEr again (step S302). A series of processes including application of the erase voltage VEr and verification of the threshold voltages in the memory cells carried out by applying the erase verify voltage Vevrf is called an erase loop. When any of the threshold voltages is not lower than the target threshold voltage and the erase voltage apply operation is performed again, the magnitude of the erase voltage VEr is made larger than the erase voltage VEr of the previous erase loop. The erase loop is repeated until the threshold voltages of all the memory cells falls below the target threshold voltage.

<4> Basics of Status Polling

Status polling will be described with reference to FIG. 9. The status polling is an operation in which the controller 3 repeatedly issues a status read command SR to the NAND flash memory 2. The status read command is a command issued from the controller 3 to the NAND flash memory 2. The NAND flash memory 2 that receives the status read command transmits the status of the NAND flash memory 2 at the time of reception (described as a NAND status in the figure) to the controller 3. The status includes information indicating whether the NAND flash memory 2 is executing a command. A state in which the command is being executed is called a busy state and a state in which the command is not being executed is called a ready state. That is, the NAND flash memory 2 transmits to the controller 3 the status indicating that the NAND flash memory 2 is in a busy state when the status read command is received during a command execution by the NAND flash memory 2 (e.g., when the status read commands SR1 to SR5 is received in FIG. 9). When the status read command is received after the command is completed, that is, when the command is not being executed (e.g., when the status read command SR6 is received in FIG. 9), the NAND flash memory 2 transmits to the controller 3 a status indicating that the NAND flash memory 2 is in a ready state. The controller 3 may have issued commands such as a read command, a program command, and an erase command prior to checking the status of the NAND flash memory 2. By performing a status polling, the controller 3 confirms the command execution status of the NAND flash memory 2.

The controller 3 performs a status polling to confirm the command execution status of the NAND flash memory 2. When the frequency of status polling is shortened, the power consumption may increase or the communication by the status read command may occupy the NAND interface 35, and the performance of the memory system 1 may deteriorate. When the frequency of status polling is lengthened, the detection of the ready state of the NAND flash memory 2 by the controller 3 may be delayed, and the performance of the memory system 1 may deteriorate. For this reason, it is desirable to perform the status polling at an appropriate frequency.

The time tables used in the present embodiment will be described with reference to FIGS. 10, 11, and 12.

The time table illustrated in FIG. 10 represents the time taken from the start of the sensing operation of the upper page and the lower page to the completion thereof. The sense time of the upper page is Tup, and the sense time of the lower page is Tlow.

Figure 11:
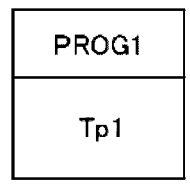
FIG. 11 is a table used during the data write operation according to the first embodiment.

The time table illustrated in FIG. 11 represents the time Tp1 taken from the start of one program loop to the completion thereof. For example, the time required for five program loops is a time that is five times Tp1.

Figure 12:
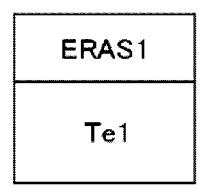
FIG. 12 is a table used during the data erase operation according to the first embodiment.

The time table illustrated in FIG. 12 represents the time Te1 taken from the start of one erase loop to the completion thereof. For example, the time required for five erase loops is a time that is five times Te1.

The storage location of such time tables may be a management data storage area of a part of the memory cell array 21 of the NAND flash memory 2 or a ROM. Such time tables may be stored in the controller 3. Further, the value of each time table may be a predefined value or an actually-measured value. In the case of the actually-measured value, the value may be written in each time table in the test step before shipment of the memory system, or the value of the corresponding time table may be updated every read operation, write operation, or erase operation.

The read operation of the present embodiment will be described with reference to FIGS. 13 and 14. The time table is assumed to be stored in the NAND flash memory 2.

Figure 13:
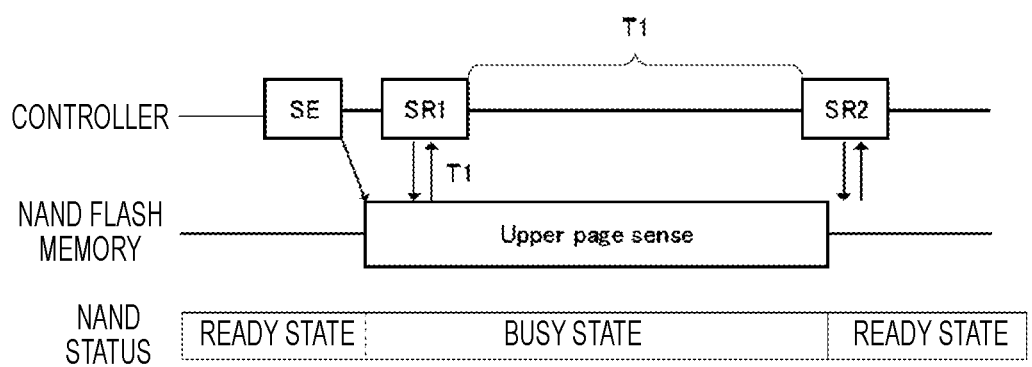
FIGS. 13-14 are time charts illustrating the data read operation according to the first embodiment.

FIG. 13 illustrates the operation of the memory system 1 at the time of sensing the upper page. The controller 3 issues a sense command SE that designates an upper page to the NAND flash memory 2. The NAND flash memory 2 that receives the sense command SE performs the sensing operation for the upper page. The controller 3 issues a first status read command SR1 to the NAND flash memory 2. With the status read command SR1, the controller 3 acquires the status of the NAND flash memory 2 and a read operation duration time T1.

When the time table is stored in the NAND flash memory 2, the NAND flash memory 2 that receives the status read command refers to the time table according to the operation being executed at the time of receiving the status read command, and transmits the read operation duration time to the controller 3. That is, when receiving the status read command SR1, the NAND flash memory 2 transmits an upper page read time Tup of the time table illustrated in FIG. 10 to the controller 3 as the read operation duration time T1.

When the read operation duration time T1 has elapsed, the controller 3 issues a second status read command SR2 to the NAND flash memory 2. The timer 37 is used to measure the read operation duration time T1. By measuring the read operation duration time, the timing at which the sensing operation of the NAND flash memory 2 is completed may be predicted, so that it is not necessary to perform a status polling.

Figure 14:
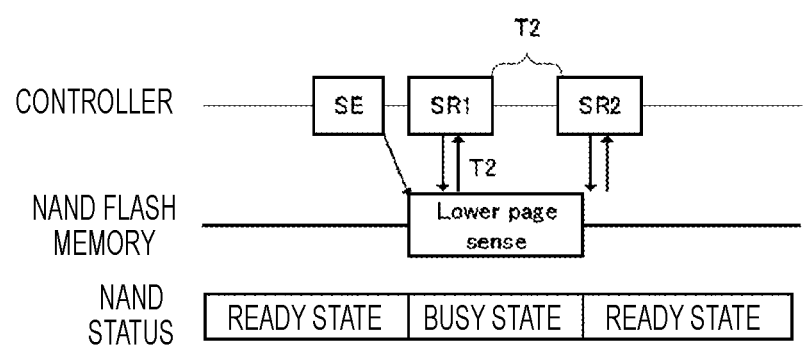

FIG. 14 illustrates the operation of the memory system 1 at the time of sensing the lower page. The controller 3 issues a sense command SE that designates the lower page to the NAND flash memory 2. The NAND flash memory 2 that receives the sense command SE performs the sensing operation for the lower page. The controller 3 issues a first status read command SR1 to the NAND flash memory 2. With the status read command SR1, the controller 3 acquires the status of the NAND flash memory 2 and a read operation duration time T2.

When the time table is stored in the NAND flash memory 2, the NAND flash memory 2 that receives the status read command refers to the time table according to the operation being executed at the time of receiving the status read command, and transmits the read operation duration time to the controller 3. That is, when receiving the status read command SR1, the NAND flash memory 2 transmits the lower page read time Tlow of the time table illustrated in FIG. 10 to the controller 3 as the read operation duration time T2.

When the read operation duration time T2 has elapsed, the controller 3 issues the second status read command SR2 to the NAND flash memory 2. The timer 37 is used to measure the read operation duration time T2. By measuring the operation duration time, the timing at which the sensing operation of the NAND flash memory 2 is completed may be predicted, so that it is not necessary to perform a status polling.

When the time table is stored in the controller 3, the NAND flash memory 2 that receives the status read command SR1 transmits the operation being executed at the time of receiving the status read command SR1 to the controller 3 as a status. The controller 3 refers to the time table based on the status of the NAND flash memory 2 to acquire the read operation duration time. That is, when the controller 3 acquires the status that the NAND flash memory 2 is reading the upper page by the status read command SR1, the controller 3 acquires the upper page read time Tup of the time table illustrated in FIG. 10 as the read operation duration time T1. Further, when the controller 3 acquires the status that the NAND flash memory 2 is reading the lower page by the status read command SR1, the controller 3 acquires the lower page read time Tlow of the time table illustrated in FIG. 10 as the read operation duration time T2.

A time from when the NAND flash memory 2 receives a command issued from the controller 3 and starts the operation to when the status read command SR is received may be measured by a timer (not illustrated) in the NAND flash memory 2. In this case, the time until the status read command SR is received is subtracted from Tup or Tlow on the time table, and the subtracted value is set as the read operation duration time T1 or T2.

In FIGS. 13 and 14, it is assumed that the time from issuing the sense command SE to issuing the status read command SR1 is the same. In the MLC method, as described above, the sense time for lower page read is shorter than the sense time for upper page read. Therefore, the read operation duration time T2 during the lower page sensing is shorter than the read operation duration time T1 during the upper page sensing.

The write operation of the present embodiment will be described with reference to FIGS. 15 and 16.

The controller 3 issues a program command PGM to the NAND flash memory 2. The NAND flash memory 2 repeatedly executes the program loop PROG to perform the write operation. For example, it is assumed that the write operation is completed in five program loops. Further, it is assumed that the time table is provided in the NAND flash memory 2.

Figure 15:
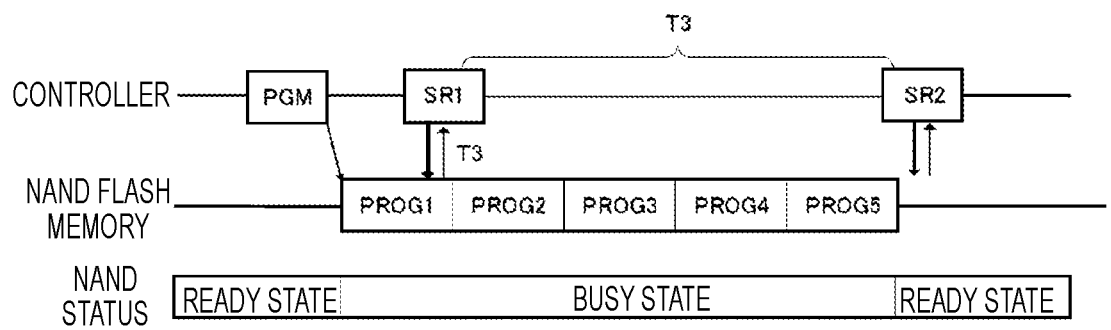
FIGS. 15-16 are time charts illustrating the data write operation according to the first embodiment.

FIG. 15 illustrates the operation of the memory system 1 when the controller 3 issues a status read command during the first program loop PROG1. The controller 3 issues a first status read command SR1 to the NAND flash memory 2. With the status read command SR1, the controller 3 acquires the status of the NAND flash memory 2 and a write operation duration time T3.

The NAND flash memory 2 that receives the status read command calculates the remaining number of program loops from the number of program loops required to complete the write operation and the number of program loops completed by the time the status read command is received. The NAND flash memory 2 refers to the remaining number of program loops and the time table, and transmits the write operation duration time to the controller 3. That is, when receiving the status read command SR1, the NAND flash memory 2 subtracts the number of program loops (1 time) completed by the time the status read command is received from the number of program loops (5 times) required to complete the write operation, and calculates the remaining number of program loops (4 times). The NAND flash memory 2 multiplies the program loop time Tp1 in the time table illustrated in FIG. 11 by 4 to calculate the write operation duration time T3. The NAND flash memory 2 transmits the write operation duration time T3 to the controller 3.

When the write operation duration time T3 has elapsed, the controller 3 issues the second status read command SR2 to the NAND flash memory 2. The timer 37 is used to measure the write operation duration time T3. It is not necessary to perform a status polling because the timing at which the write operation of the NAND flash memory 2 is completed may be predicted by measuring the write operation duration time.

Figure 16:
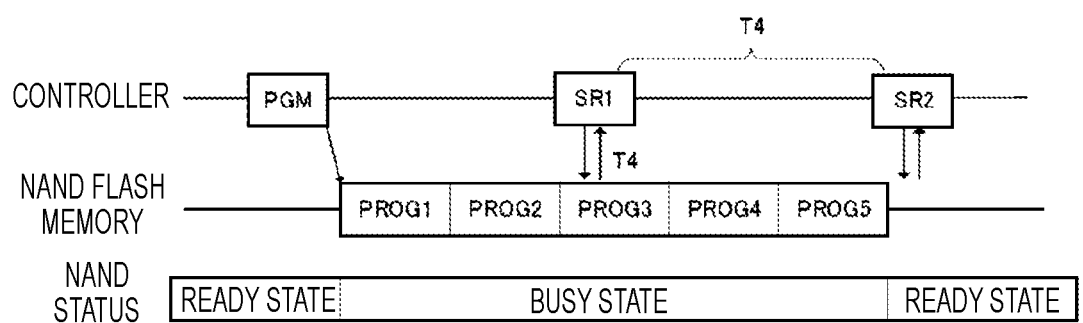

FIG. 16 illustrates the operation of the memory system 1 when the controller 3 issues a status read command during the third program loop PROG3. As in FIG. 15, when receiving the status read command SR1, the NAND flash memory 2 subtracts the number of program loops (3 times) completed by the time the status read command is received from the number of program loops (5 times) required to complete the write operation, and calculates the remaining number of program loops (2 times). The NAND flash memory 2 multiplies the program loop time Tp1 in the time table illustrated in FIG. 11 by 2 to calculate a write operation duration time T4. The NAND flash memory 2 transmits the write operation duration time T4 to the controller 3.

When the write operation duration time T4 has elapsed, the controller 3 issues the second status read command SR2 to the NAND flash memory 2. The timer 37 is used to measure the write operation duration time T4. It is not necessary to perform a status polling because the timing at which the write operation of the NAND flash memory 2 is completed may be predicted by measuring the write operation duration time.

As between the write operation duration time T3 when the first status read command SR1 is issued during the first program loop PROG1, and the write operation duration time T4 when the first status read command SR1 is issued during the third program loop PROG3, the write operation duration time T4 is shorter.

When the time table is stored in the controller 3, the NAND flash memory 2 that receives the status read command SR1 transmits the number of program loops required to complete the write operation and the number of program loops completed by the time the status read command SR is received to the controller 3 as a status. The controller 3 calculates the remaining number of program loops based on the status of the NAND flash memory 2 and refers to the time table to acquire the write operation duration time. That is, with the status read command SR1, the controller 3 acquires as the status that the number of program loops required to complete the write operation is 5 and that the number of program loops completed by the time the status read command SR1 is received is 1 or 3. The controller 3 calculates that the remaining number of program loops is 4 or 2, and acquires the time obtained by multiplying the program loop time Tp1 of the time table illustrated in FIG. 11 by 4 or 2 as the write operation duration time T3 or T4.

Although it has been described here that the write operation is completed in five program loops, the number of times may be derived from a previous write operation or may be set at the time of shipment of the memory system 1.

Further, when the NAND flash memory 2 is in a busy state upon receipt of the second status read command SR2, the controller 3 issues a third status read command after the program loop time Tp1 has elapsed, assuming that another program loop is required until the write operation is completed. The number of program loops required to complete the write operation when the controller 3 issues the third status read command may be derived from a previous write operation.

When the NAND flash memory 2 is in the busy state upon receipt of the second status read command SR2, the controller 3 updates information on the number of program loops required to complete the write operation. The information on the number of program loops required until the write operation is completed may be stored in the NAND flash memory 2 or the memory 32.

The erase operation of the present embodiment will be described with reference to FIGS. 17 and 18.

The controller 3 issues an erase command ER to the NAND flash memory 2. The NAND flash memory 2 repeatedly executes the erase loop ERAS to execute the erase operation. For example, it is assumed that the erase operation is completed after five erase loops. Further, it is assumed that the time table is provided in the NAND flash memory 2.

Figure 17:
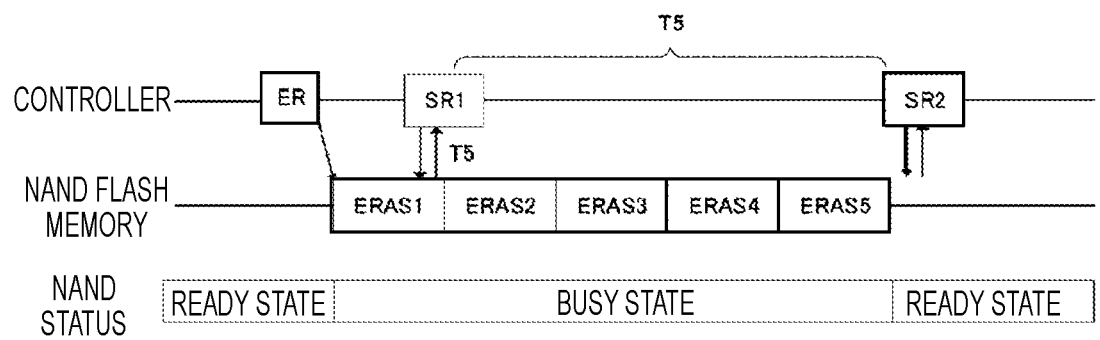
FIGS. 17-18 are time charts illustrating the data erase operation according to the first embodiment.

FIG. 17 illustrates the operation of the memory system 1 when the controller 3 issues a status read command during the first erase loop ERAS1. The controller 3 issues the first status read command SR1 to the NAND flash memory 2.

With the status read command SR1, the controller 3 acquires the status of the NAND flash memory 2 and an erase operation duration time T5.

The NAND flash memory 2 that receives the status read command calculates the remaining number of erase loops from the number of erase loops required to complete the erase operation and the number of erase loops completed by the time the status read command is received. The NAND flash memory 2 refers to the remaining number of erase loops and the time table, and transmits the erase operation duration time to the controller 3. That is, when receiving the status read command SR1, the NAND flash memory 2 subtracts the number of erase loops (1 time) completed by the time the status read command is received from the number of erase loops (5 times) required to complete the erase operation, and calculates the remaining number of erase loops (4 times). The NAND flash memory 2 multiplies the erase loop time Te1 in the time table illustrated in FIG. 12 by 4 to calculate the erase operation duration time T5. The NAND flash memory 2 transmits the erase operation duration time T5 to the controller 3.

When the erase operation duration time T5 has elapsed, the controller 3 issues the second status read command SR2 to the NAND flash memory 2. The timer 37 is used to measure the erase operation duration time T5. It is not necessary to perform a status polling because the timing when the erase operation of the NAND flash memory 2 is completed may be predicted by measuring the erase operation duration time.

Figure 18:
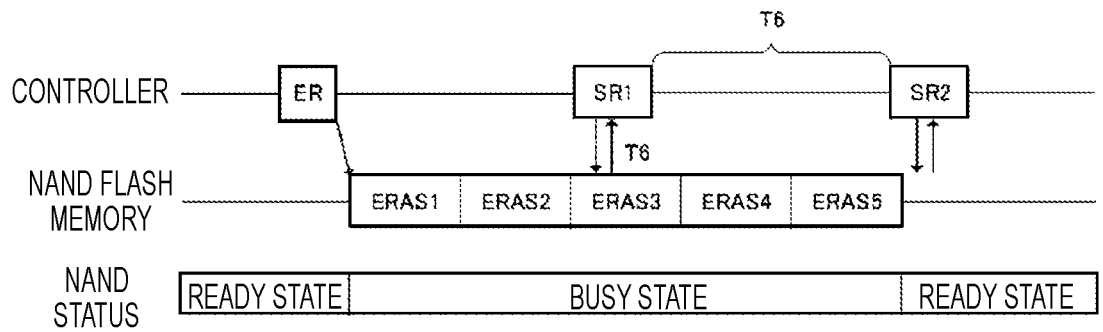

FIG. 18 illustrates the operation of the memory system 1 when the controller 3 issues a status read command during the third erase loop ERAS3. As in FIG. 17, when receiving the status read command SR1, the NAND flash memory 2 subtracts the number of erase loops (3 times) completed by the time the status read command is received from the number of erase loops (5 times) required to complete the erase operation, and calculates the remaining number of erase loops (2 times). The NAND flash memory 2 multiplies the erase loop time Te1 in the time table illustrated in FIG. 12 by 2 to calculate an erase operation duration time T6. The NAND flash memory 2 transmits the erase operation duration time T6 to the controller 3.

When the erase operation duration time T6 is elapsed, the controller 3 issues the second status read command SR2 to the NAND flash memory 2. The timer 37 is used to measure the erase operation duration time T6. It is not necessary to perform a status polling because the timing when the erase operation of the NAND flash memory 2 is completed may be predicted by measuring the operation duration time.

As between the erase operation duration time T5 when the first status read command SR1 is issued during the first erase loop ERAS1, and the erase operation duration time T6 when the first status read command SR1 is issued during the third erase loop ERAS3, the erase operation duration time T6 is shorter.

When the time table is stored in the controller 3, the NAND flash memory 2 that receives the status read command SR1 transmits the number of erase loops required to complete the erase operation and the number of erase loops completed by the time the status read command SR is received to the controller 3 as a status. The controller 3 calculates the remaining number of erase loops based on the status of the NAND flash memory 2, and refers to the time table to acquire the erase operation duration time. That is, with the status read command SR1, the controller 3 acquires as the status that the number of erase loops required to complete the erase operation is 5 and that the number of erase loops completed by the time the status read command SR1 is received is 1 or 3. The controller 3 calculates that the remaining number of erase loops is 4 or 2, and acquires the time obtained by multiplying the erase loop time Te1 in the time table illustrated in FIG. 12 by 4 or 2 as the erase operation duration time T5 or T6.

Further, when the NAND flash memory 2 is in a busy state upon receipt of the second status read command SR2, the controller 3 issues a third status read command after the erase loop time Te1 has elapsed, assuming that another erase loop is required until the erase operation is completed. The number of erase loops required to complete the erase operation when the controller 3 issues the third status read command may be derived from a previous erase operation.

When the NAND flash memory 2 is in the busy state upon receipt of the second status read command SR2, the controller 3 updates information on the number of erase loops required to complete the erase operation. The information on the number of erase loops required until the erase operation is completed may be stored in the NAND flash memory 2 or the memory 32.

Figure 19:
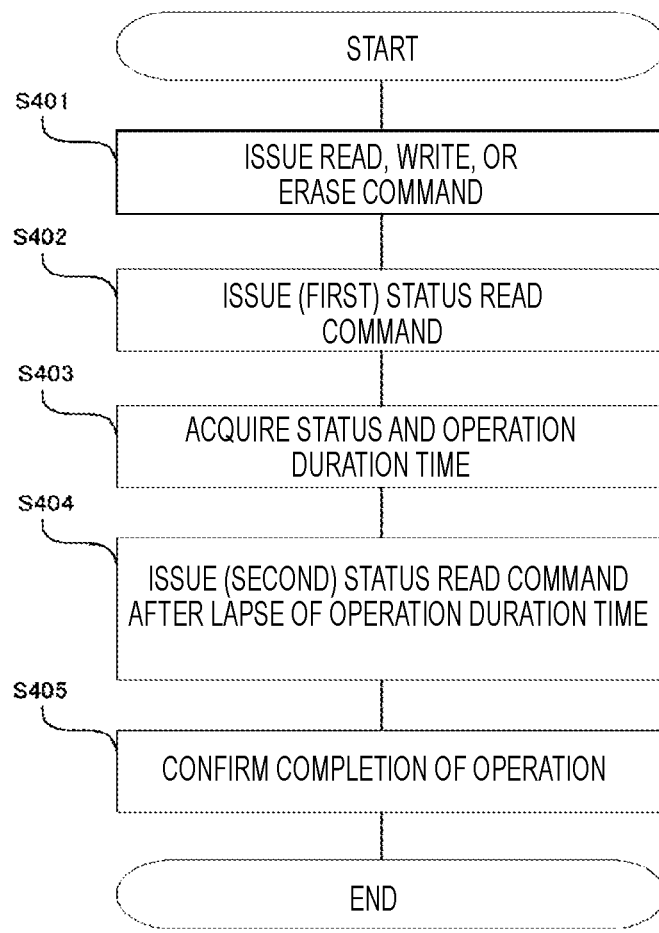
FIG. 19 is a flowchart illustrating an overall operation of the memory system according to the first embodiment.

FIG. 19 is a flowchart of the read, write, or erase operation according to the present embodiment. After issuing the read, write, or erase command (step S401), the controller 3 issues the first status read command (step S402). The controller 3 acquires the status of the NAND flash memory 2 and the operation duration time according to the execution status of the read, write, or erase operation (step S403). After the lapse of the operation duration time, the controller 3 issues the second status read command (step S404). This confirms the completion of the read, write, or erase operation of the NAND flash memory 2 (step S405).

In the memory system 1 of the present embodiment, the controller 3 can confirm the status of the NAND flash memory 2 without performing a status polling, and the power consumption of the memory system 1 can be reduced. Further, since the communication between the NAND flash memory 2 and the controller 3 is not occupied by the status polling, the performance of the entire memory system can be improved.

Second Embodiment

A memory system according to a second embodiment will be described. In the present embodiment, the configuration of the memory system 1 and the basic operations of reading, writing, erasing, and status polling are the same as those in the first embodiment.

A read operation of the present embodiment will be described with reference to FIGS. 20 and 21.

The controller 3 issues a sense command SE to the NAND flash memory 2. The NAND flash memory 2 performs a sensing operation. The controller 3 issues a status read command SR to the NAND flash memory 2. With the status read command, the controller 3 acquires the status of the NAND flash memory 2 and information on which page is being sensed. An execution stage of the sensing operation of the NAND flash memory 2 includes, for example, the upper page sensing operation and the lower page sensing operation. The controller 3 changes the frequency of status polling, that is, the issuance interval of the status read command SR depending on the execution stage of the acquired sense operation. Specifically, the controller 3 adjusts the issuance interval of the status read command SR between several hundreds of nanoseconds and several microseconds. With the status polling, the controller 3 confirms the completion of the read operation of the NAND flash memory 2.

Figure 20:
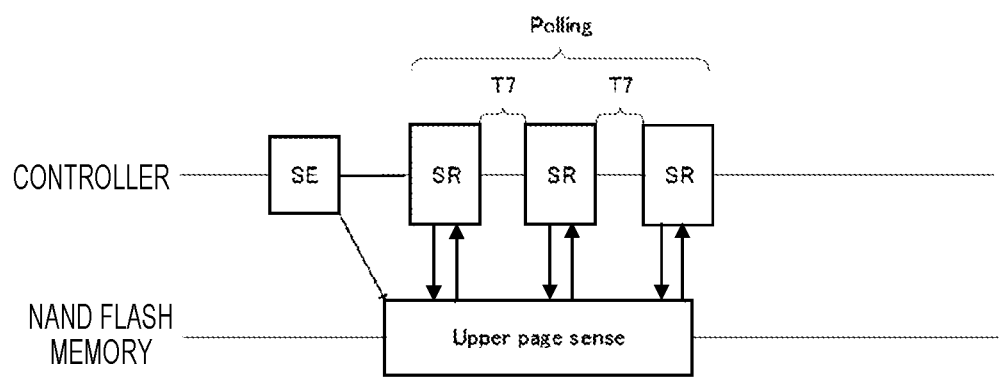
FIGS. 20-21 are time charts illustrating a data read operation according to a second embodiment.
Figure 20:
Figure 21:
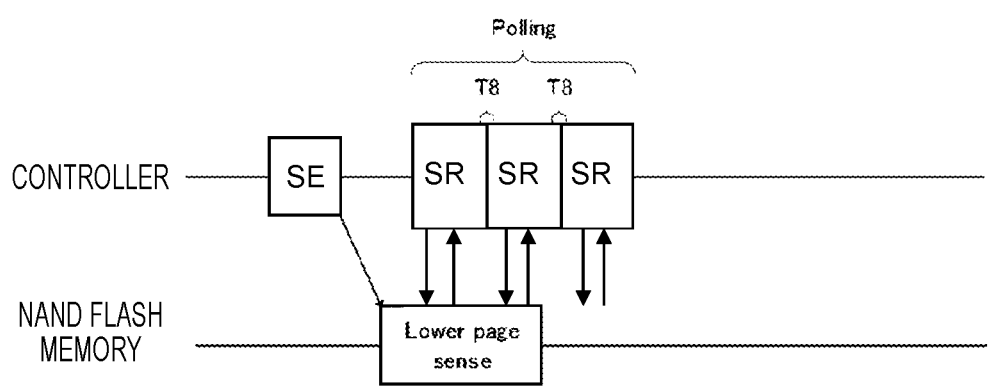
Figure 21:

FIG. 20 illustrates the operation of the memory system 1 during the upper page sensing operation, and FIG. 21 illustrates the operation of the memory system 1 during the lower page sensing operation. When confirming that the NAND flash memory 2 is performing the upper page sensing operation, the controller 3 issues the status read command SR at an interval T7. Further, when confirming that the NAND flash memory 2 is performing the lower page sensing operation, the controller 3 issues the status read command SR at an interval T8. Since reading the upper page takes longer than reading the lower page, T7 is longer than T8.

A write operation of the present embodiment will be described with reference to FIG. 22.

The controller 3 issues a program command PGM to the NAND flash memory 2. The NAND flash memory 2 executes a write operation, and repeatedly executes a program loop including a program operation (Program) and a program verify operation (Verify). The write operation of the NAND flash memory 2 includes two execution stages, that is, the program operation and the program verify operation. The controller 3 issues a status read command SR to the NAND flash memory 2. With the status read command SR, the controller 3 confirms the status of the NAND flash memory 2 and the execution stage of the write operation. The controller 3 changes the frequency of status polling, that is, the issuance interval of the status read command SR depending on the execution stage of the write operation. Specifically, the controller 3 adjusts the issuance interval of the status read command SR between several microseconds and several tens of microseconds. For example, when confirming that the NAND flash memory 2 is performing the program operation, the controller 3 issues the status read command SR at an interval T9. Further, when confirming that the NAND flash memory 2 is performing the program verify operation, the controller 3 issues the status read command SR at an interval T10. Since the program operation takes longer than the program verify operation, T9 is longer than T10.

Figure 22:
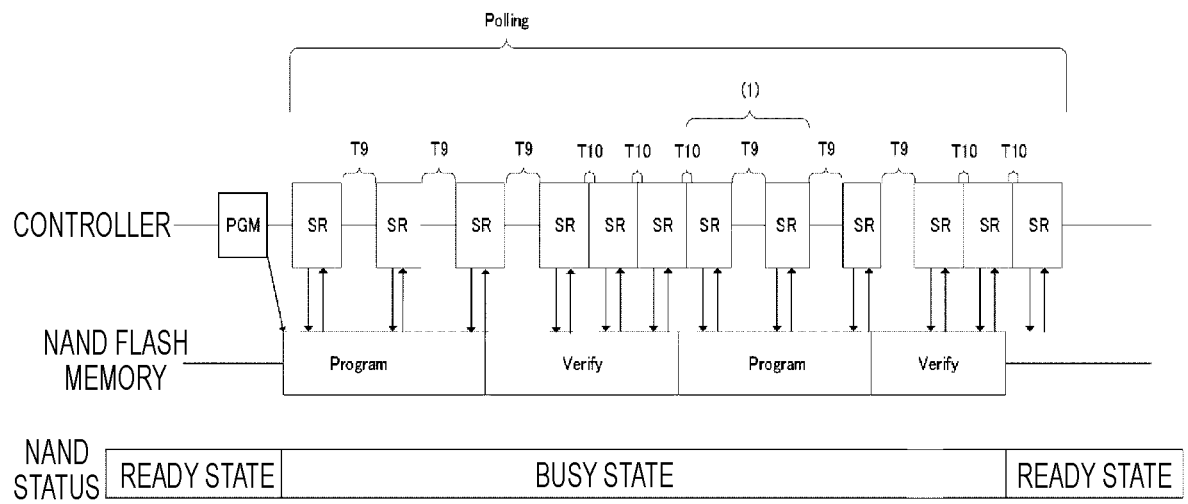
FIG. 22 is a time chart illustrating a data write operation according to the second embodiment.

When the NAND flash memory 2 executes the program operation again after executing the program verify operation as in item (1) of FIG. 22, the status read command SR issued at the issuance interval T10 informs the controller 3 that the NAND flash memory 2 executes the program operation again. The controller 3 adjusts the frequency of subsequent status polling, and sets the issuance interval of the status read command SR to T9.

That is, the controller 3 confirms the execution stage of the write operation of the NAND flash memory 2 by the status read command SR, and adjusts the issuance interval of the status read command SR. The controller 3 confirms the completion of the write operation of the NAND flash memory 2 by the frequency-controlled status polling.

An erase operation of the present embodiment will be described with reference to FIG. 23.

The controller 3 issues an erase command ER to the NAND flash memory 2. The NAND flash memory 2 executes the erase operation, and repeatedly executes the erase loop including an erase voltage apply operation (Erase) and an erase verify operation (Verify). The erase operation of the NAND flash memory 2 includes two execution stages, that is, the erase voltage apply operation and the erase verify operation. The controller 3 issues a status read command SR to the NAND flash memory 2. With the status read command SR, the controller 3 confirms the status of the NAND flash memory 2 and the execution stage of the erase operation. The controller 3 changes the frequency of status polling, that is, the issuance interval of the status read command SR depending on the execution stage of the erase operation. Specifically, the controller 3 adjusts the issuance interval of the status read command SR between several microseconds and several tens of microseconds. For example, when confirming that the NAND flash memory 2 is executing the erase voltage apply operation, the controller 3 issues the status read command SR at an interval T11. Further, when confirming that the NAND flash memory 2 is executing the erase verify operation, the controller 3 issues the status read command SR at an interval T12. Since the erase voltage apply operation takes longer than the erase verify operation, T11 is longer than T12.

Figure 23:
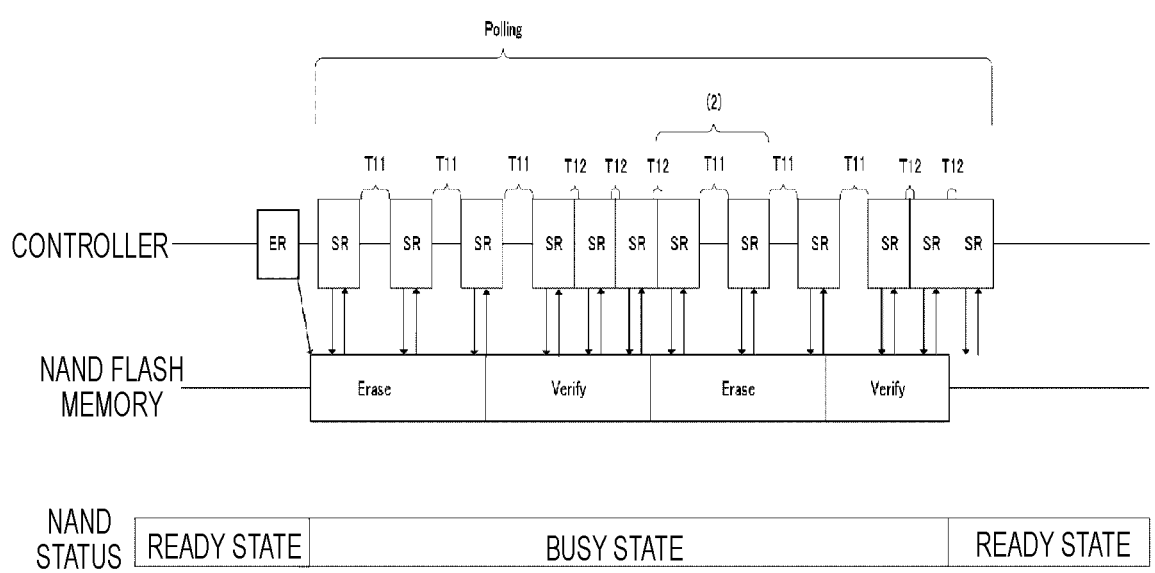
FIG. 23 is a time chart illustrating a data erase operation according to the second embodiment.

As indicated by item (2) of FIG. 23, when the NAND flash memory 2 executes the erase voltage apply operation again after executing the erase verify operation, the status read command SR issued at the issuance interval T12 informs the controller 3 that the NAND flash memory 2 performs the erase voltage apply operation again. The controller 3 adjusts the frequency of subsequent status polling and sets the issuance interval of the status read command SR to T11.

That is, the controller 3 confirms the execution stage of the erase operation of the NAND flash memory 2 with the status read command SR and adjusts the issuance interval of the status read command SR. The controller 3 confirms the completion of the erase operation of the NAND flash memory 2 by the frequency-controlled status polling.

Figure 24:
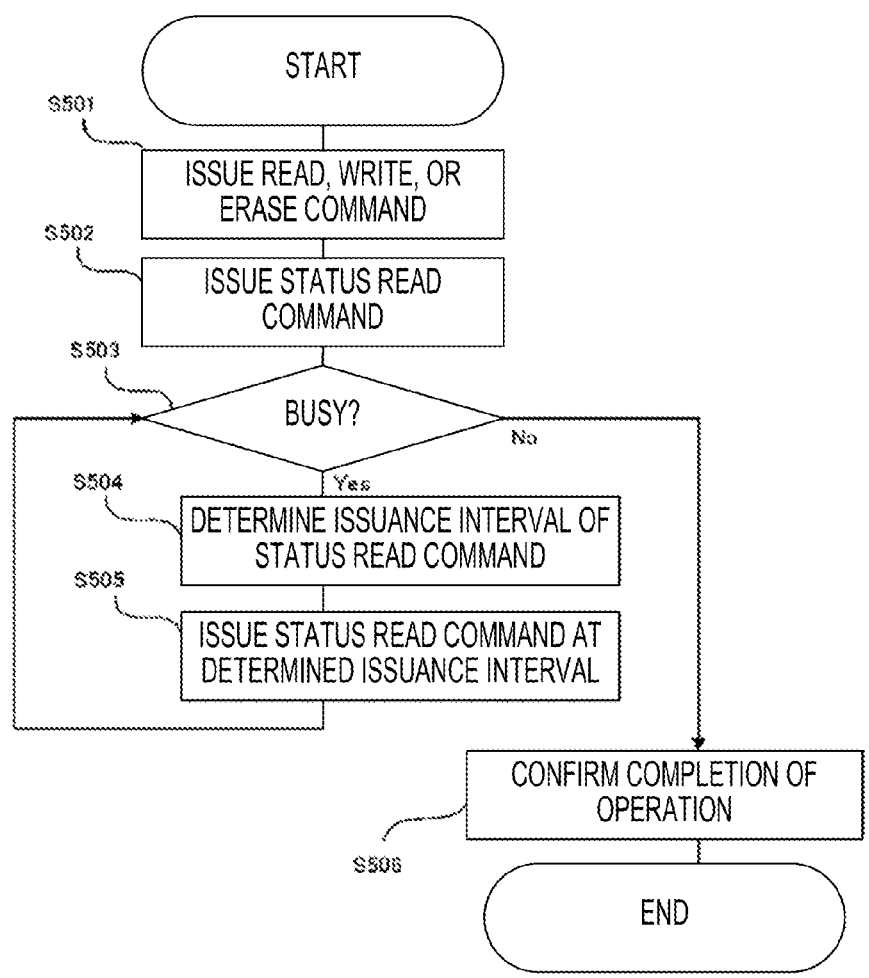
FIG. 24 is a flowchart illustrating an overall operation of a memory system according to the second embodiment.

FIG. 24 is a flowchart of read, write, or erase operation according to the present embodiment. The controller 3 issues a read, write, or erase command (step S501) and then issues a status read command (step S502). The controller 3 confirms the status of the NAND flash memory 2 with the status read command (step S503). When the NAND flash memory 2 is in a busy state ("Yes" in step S503), the controller 3 confirms the execution stage of the read, write, or erase operation, and determines the frequency of status polling, that is, the issuance interval of the status read command (step S504). When the required time of the execution stage of the operation performed by the NAND flash memory 2 is long, the controller 3 determines the issuance interval of the status read command to be long, and determines the issuance interval of the status read command to be short when the required time is short. The controller 3 issues a status read command at the determined issuance interval (step S505). Based on the status read command issued in step 505, the controller 3 confirms the status of the NAND flash memory 2 again (step S503), and when the NAND flash memory 2 is in a ready state ("No" in step S503), the completion of the operation is confirmed (step S506). By the status polling controlled as described above, the controller 3 confirms the completion of the read, write, and erase operations of the NAND flash memory 2.

In the memory system 1 of the present embodiment, the controller 3 can reduce the power consumption of the memory system 1 by adjusting the frequency of status polling, and can improve the performance of the entire memory system 1.

While certain embodiments have been described, these embodiments have been presented by way of example only, and are not intended to limit the scope of the disclosures. Indeed, the novel embodiments described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A memory system comprising:
a non-volatile memory; and
a controller configured to issue a first command requesting a first operation to the non-volatile memory and a second command requesting the non-volatile memory to transmit a duration time for executing the first operation to the non-volatile memory.

2. The memory system according to claim 1, wherein the controller is configured to issue the second command when the non-volatile memory is executing the first operation.

3. The memory system according to claim 1, wherein the non-volatile memory is configured to determine the duration time in accordance with a progress of the first operation at a time when the non-volatile memory receives the second command.

4. The memory system according to claim 1, wherein the controller is further configured to, upon lapse of the duration time after the issuance of the second command, issue to the non-volatile memory a third command requesting a completion status of the first operation.

5. The memory system according to claim 1, wherein the controller is further configured to not issue to the non-volatile memory a third command requesting a completion status of the first operation at any time after the second command is issued and before the lapse of the duration time thereafter.

6. The memory system according to claim 1, wherein the first operation is one of a data read operation, a data write operation, and a data erase operation.

7. The memory system according to claim 1, wherein
the non-volatile memory includes a storage area in which information necessary for calculating the duration time of the first operation is stored, and is configured to calculate the duration time from the information stored in the storage area.

8. A memory system comprising:
a non-volatile memory; and
a controller configured to issue a first command requesting a first operation to the non-volatile memory, issue a second command requesting the non-volatile memory to transmit information indicating an execution stage of the first operation to the non-volatile memory, and set an issuance interval of a third command requesting the non-volatile memory to transmit a completion status of the first operation, according to the execution stage of the first operation.

9. The memory system according to claim 8, wherein the controller is configured to issue the second command when the non-volatile memory is executing the first operation.

10. The memory system according to claim 8, wherein the first operation is one of a data write operation and a data erase operation.

11. The memory system according to claim 10, wherein the execution stage of the first operation includes a first step of executing a process requested by the first command, and a second step of verifying the completion of the first operation.

12. The memory system according to claim 11, wherein
when the execution stage of the first operation is at the first step, the controller issues the third command at a first issuance interval, and
when the execution stage of the first operation is at the second step, the controller issues the third command at a second issuance interval shorter than the first issuance interval.

13. The memory system according to claim 12, wherein
the first operation is a data write operation, and
the non-volatile memory performs a voltage apply operation for writing data in the first step, and performs a verification operation to verify whether the data has been written in the second step.

14. The memory system according to claim 12, wherein
the first operation is a data erase operation, and
the non-volatile memory performs a voltage apply operation for erasing data in the first step, and performs a verification operation to verify whether the data has been erased in the second step.

15. A method of controlling a non-volatile memory, the method comprising:
issuing a first command requesting a first operation to the non-volatile memory; and
issuing a second command requesting the non-volatile memory to transmit a duration time for executing the first operation the non-volatile memory.

16. The method according to claim 15, wherein the information that is returned includes an execution stage of the first operation.

17. The method according to claim 15, further comprising:
upon receiving a non-completion status in response to the third command, the non-completion status indicating that the non-volatile memory has not completed the first operation, updating information stored in the non-volatile memory based on which the timing information is derived.

18. The method according to claim 15, wherein the first operation is one of a data read operation, a data write operation, and a data erase operation.

19. The method according to claim 15, wherein the second command is issued when the non-volatile memory is executing the first operation.

20. The method according to claim 15, further comprising:
issuing a third command at a timing determined based on the duration time.

* * * * *

UNITED STATES PATENT AND TRADEMARK OFFICE
CERTIFICATE OF CORRECTION

PATENT NO. : 11,494,123 B2
APPLICATION NO. : 17/150991
DATED : November 8, 2022
INVENTOR(S) : Katsuya Kanamori et al.

It is certified that error appears in the above-identified patent and that said Letters Patent is hereby corrected as shown below:

In the Claims

In Column 16, Claim 15, Line 34, please insert --to-- after "first operation".

Signed and Sealed this
Twenty-second Day of August, 2023

Katherine Kelly Vidal
*Director of the United States Patent and Trademark Office*